US007906821B2

(12) United States Patent
Hayashi et al.

(10) Patent No.: US 7,906,821 B2
(45) Date of Patent: Mar. 15, 2011

(54) SEMICONDUCTOR DEVICE

(75) Inventors: Masahiro Hayashi, Sakata (JP); Takahisa Akiba, Tsuruoka (JP); Kunio Watanabe, Sakata (JP); Tomo Takaso, Chino (JP); Susumu Kenmochi, Tsuruoka (JP)

(73) Assignee: Seiko Epson Corporation (JP)

( * ) Notice: Subject to any disclaimer, the term of this patent is extended or adjusted under 35 U.S.C. 154(b) by 260 days.

(21) Appl. No.: 12/129,191

(22) Filed: May 29, 2008

(65) Prior Publication Data

US 2008/0237747 A1 Oct. 2, 2008

Related U.S. Application Data

(62) Division of application No. 11/519,169, filed on Sep. 11, 2006, now Pat. No. 7,394,137.

(30) Foreign Application Priority Data

Sep. 13, 2005 (JP) ................................ 2005-265483

(51) Int. Cl.
  *H01L 29/76* (2006.01)
  *H01L 29/94* (2006.01)
  *H01L 29/788* (2006.01)
  *H01L 27/148* (2006.01)
  *H01L 29/768* (2006.01)

(52) U.S. Cl. ......... 257/409; 257/314; 257/316; 257/249

(58) Field of Classification Search .................. 257/758, 257/750, 484, 407, 288, 344, 127, 409, 314–320, 257/336, 401, 341, 347, 328, 349
See application file for complete search history.

(56) References Cited

U.S. PATENT DOCUMENTS

| 5,493,142 | A | * | 2/1996 | Randazzo et al. | ............ 257/328 |
| 5,898,206 | A | | 4/1999 | Yamamoto | |
| 6,245,639 | B1 | * | 6/2001 | Tsai et al. | ...................... 438/424 |
| 6,429,081 | B1 | * | 8/2002 | Doong et al. | ................. 438/301 |
| 6,495,408 | B1 | * | 12/2002 | Hsia et al. | ...................... 438/214 |

(Continued)

FOREIGN PATENT DOCUMENTS

JP 63-038259 2/1988

(Continued)

*Primary Examiner* — Chuong A. Luu

(74) *Attorney, Agent, or Firm* — Harness, Dickey & Pierce, P.L.C.

(57) ABSTRACT

A semiconductor device including: a semiconductor layer; a gate insulating layer; a gate electrode; a channel region; a source region and a drain region; a guard ring region; an offset insulating layer; a first interlayer dielectric; a first shield layer formed above the first interlayer dielectric and the guard ring region and electrically connected to the guard ring region; a second interlayer dielectric; and a second shield layer formed above the second interlayer dielectric, wherein the first shield layer is provided outside of both ends of the gate electrode in a channel width direction when viewed from the top side; and wherein the second shield layer is provided in at least part of a first region and/or at least part of a second region, the first region being a region between one edge of the gate electrode and an edge of the first shield layer opposite to the edge of the gate electrode in the channel width direction when viewed from the top side, and the second region being a region between the other edge of the gate electrode and an edge of the first shield layer opposite to the other edge of the gate electrode in the channel width direction when viewed from the top side.

21 Claims, 5 Drawing Sheets

U.S. PATENT DOCUMENTS

| | | |
|---|---|---|
| 6,522,007 B2 * | 2/2003 | Kouno et al. ............... 257/758 |
| 6,784,548 B2 | 8/2004 | Kouno et al. |
| 6,929,994 B2 | 8/2005 | Hayashi |
| 2002/0167091 A1 | 11/2002 | Iwasaki et al. |
| 2005/0087835 A1 | 4/2005 | Hayashi et al. |

FOREIGN PATENT DOCUMENTS

| | | |
|---|---|---|
| JP | 2001-250921 | 9/2001 |
| JP | 2002-373896 | 12/2002 |
| JP | 2003-258120 | 9/2003 |
| JP | 2005-116744 | 4/2005 |

* cited by examiner

US 7,906,821 B2

SEMICONDUCTOR DEVICE

CROSS REFERENCE TO RELATED APPLICATIONS

This application is a divisional patent application of U.S. Ser. No. 11/519,169 filed Sep. 11, 2006 now U.S. Pat. No. 7,394,137, which, claiming priority to Japanese Patent Application No. 2005-265483 filed Sep. 13, 2005, all of which are incorporated by reference.

BACKGROUND OF THE INVENTION

The present invention relates to a semiconductor device.

In recent years, portable electronic instruments have been increasingly reduced in weight and size, and research and development aiming at reducing the size of a semiconductor device provided in such electronic instruments have been conducted. As such a technology, a method has been proposed in which a low-voltage transistor for low-voltage operation and a high-voltage transistor for high-voltage operation are provided on a single substrate (single chip) to reduce the size of the entire semiconductor device provided in an electronic instrument (e.g. JP-A-2003-258120).

In this case, a parasitic MOS transistor may operate due to a high potential of a wiring layer electrically connected with the high-voltage transistor, whereby the semiconductor device may malfunction.

SUMMARY

According to one aspect of the invention, there is provided a semiconductor device comprising:

a semiconductor layer;

a gate insulating layer formed above the semiconductor layer;

a gate electrode formed above the gate insulating layer;

a channel region formed in the semiconductor layer;

a source region and a drain region formed in the semiconductor layer;

a guard ring region formed in the semiconductor layer;

an offset insulating layer formed in the semiconductor layer in a transistor formation region other than at least the channel region, the source region, and the drain region, the transistor formation region being enclosed by the guard ring region when viewed from a top side;

a first interlayer dielectric formed above the semiconductor layer;

a first shield layer formed above the first interlayer dielectric and the guard ring region and electrically connected to the guard ring region;

a second interlayer dielectric formed above the first interlayer dielectric; and a second shield layer formed above the second interlayer dielectric, wherein the first shield layer is provided outside of both ends of the gate electrode in a channel width direction when viewed from the top side; and wherein the second shield layer is provided in at least part of a first region and/or at least part of a second region, the first region being a region between one edge of the gate electrode and an edge of the first shield layer opposite to the edge of the gate electrode in the channel width direction when viewed from the top side, and the second region being a region between the other edge of the gate electrode and an edge of the first shield layer opposite to the other edge of the gate electrode in the channel width direction when viewed from the top side.

DETAILED DESCRIPTION OF THE EMBODIMENT

Figure 1:
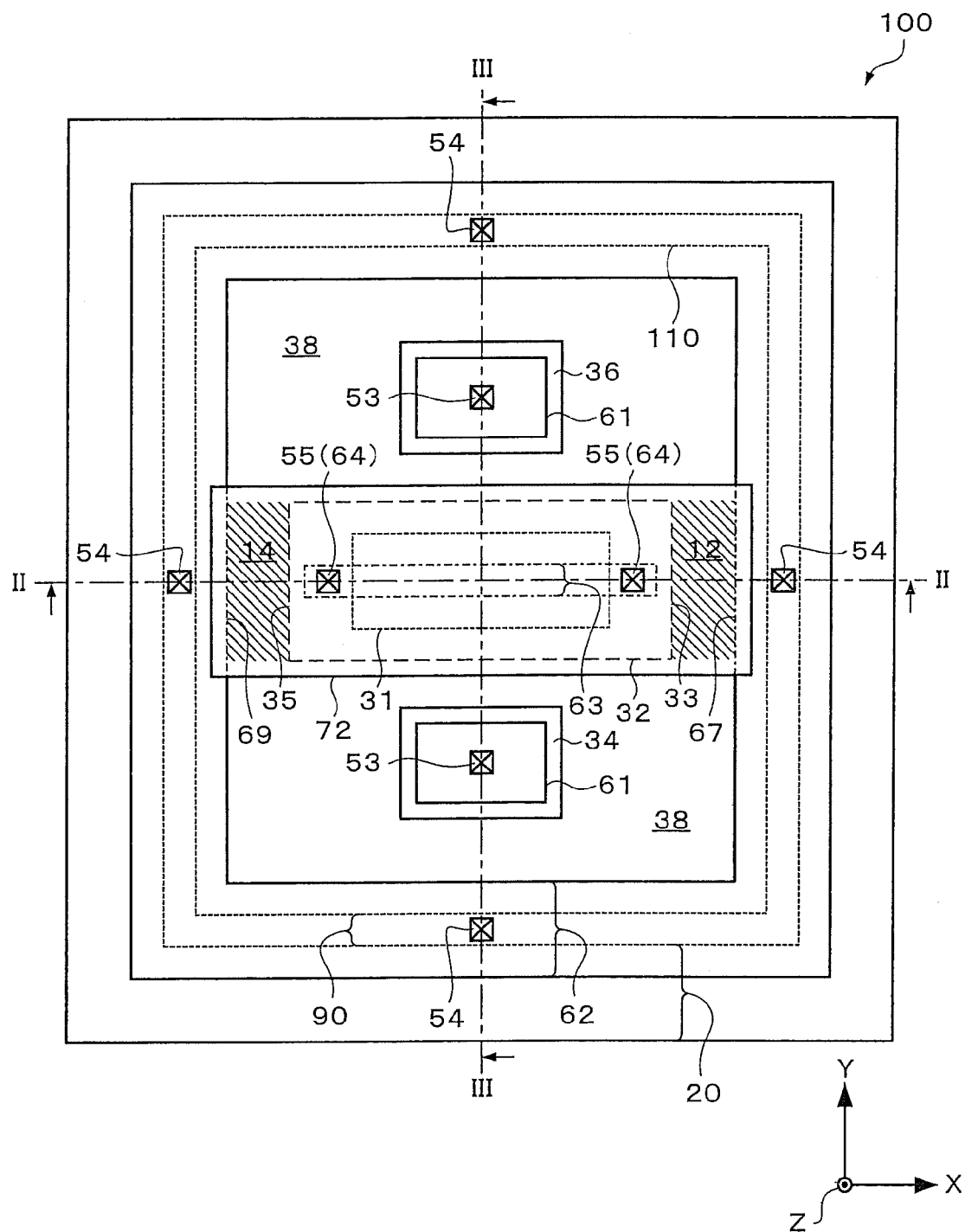
FIG. 1 is a plan view schematically showing a semiconductor device according to one embodiment of the invention.

The invention may provide a highly reliable semiconductor device.

According to one embodiment of the invention, there is provided a semiconductor device comprising:

a semiconductor layer;

a gate insulating layer formed above the semiconductor layer;

a gate electrode formed above the gate insulating layer;

a channel region formed in the semiconductor layer;

a source region and a drain region formed in the semiconductor layer;

a guard ring region formed in the semiconductor layer;

an offset insulating layer formed in the semiconductor layer in a transistor formation region other than at least the channel region, the source region, and the drain region, the transistor formation region being enclosed by the guard ring region when viewed from a top side;

a first interlayer dielectric formed above the semiconductor layer;

a first shield layer formed above the first interlayer dielectric and the guard ring region and electrically connected to the guard ring region;

a second interlayer dielectric formed above the first interlayer dielectric; and a second shield layer formed above the second interlayer dielectric, wherein the first shield layer is provided outside of both ends of the gate electrode in a channel width direction when viewed from the top side; and wherein the second shield layer is provided in at least part of a first region and/or at least part of a second region, the first region being a region between one edge of the gate electrode and an edge of the first shield layer opposite to the edge of the gate electrode in the channel width direction when viewed from the top side, and the second region being a region between the other edge of the gate electrode and an edge of the first shield layer opposite to the other edge of the gate electrode in the channel width direction when viewed from the top side.

According to this semiconductor device, the second shield layer can be set at a specific potential lower than the potential of a wiring layer formed above the second shield layer in a state in which a transistor formed in the transistor formation region is at least in an OFF state. As a result, a potential distribution due to the wiring layer does not exist or is reduced under the second shield layer. Specifically, the second shield layer can reduce the effects of the high potential applied to the wiring layer on the layer under the second shield layer. In this semiconductor device, the second shield layer is provided at least in the first region and the second region when viewed from the top side. Therefore, this semiconductor device allows the potential applied to a parasitic MOS transistor, which is formed by the wiring layer, the offset insulating layer positioned under the wiring layer, and the semiconductor layer positioned under the offset insulating layer, to be reduced in the first region and the second region. This prevents the parasitic MOS transistor from operating, whereby malfunction of the semiconductor device can be prevented. Therefore, this embodiment can provide a highly reliable semiconductor device.

In this semiconductor device, the second shield layer may be electrically connected to the gate electrode.

In this semiconductor device, the second shield layer may be electrically connected to the guard ring region.

Some embodiments of the invention will be described below, with reference to the drawings.

Figure 2:
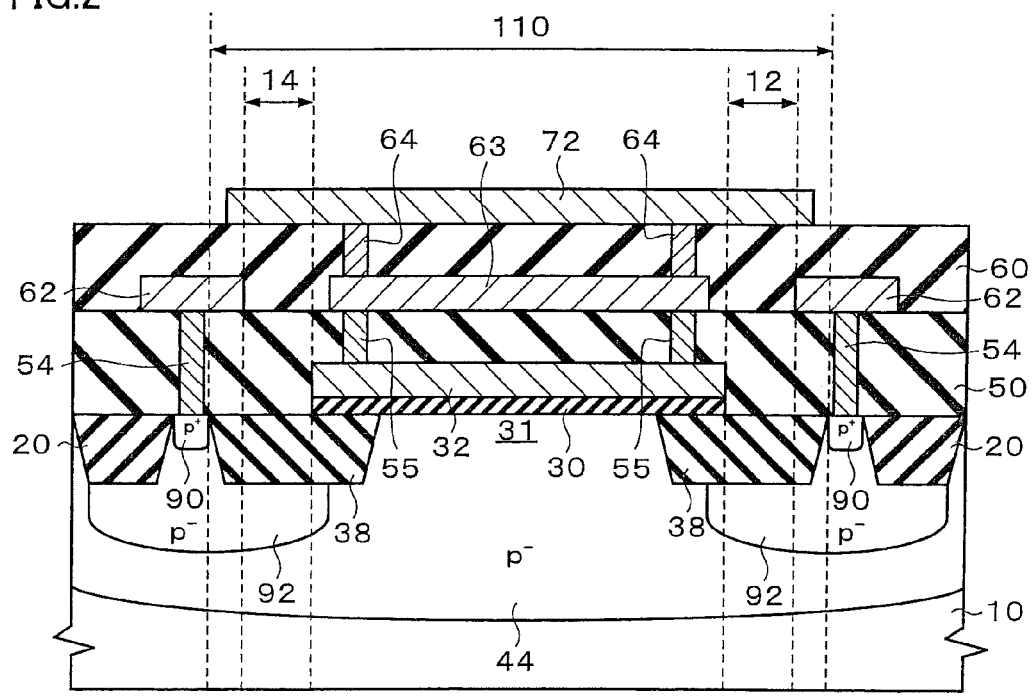
FIG. 2 is a sectional view taken along the line II-II in FIG. 1.
Figure 3:
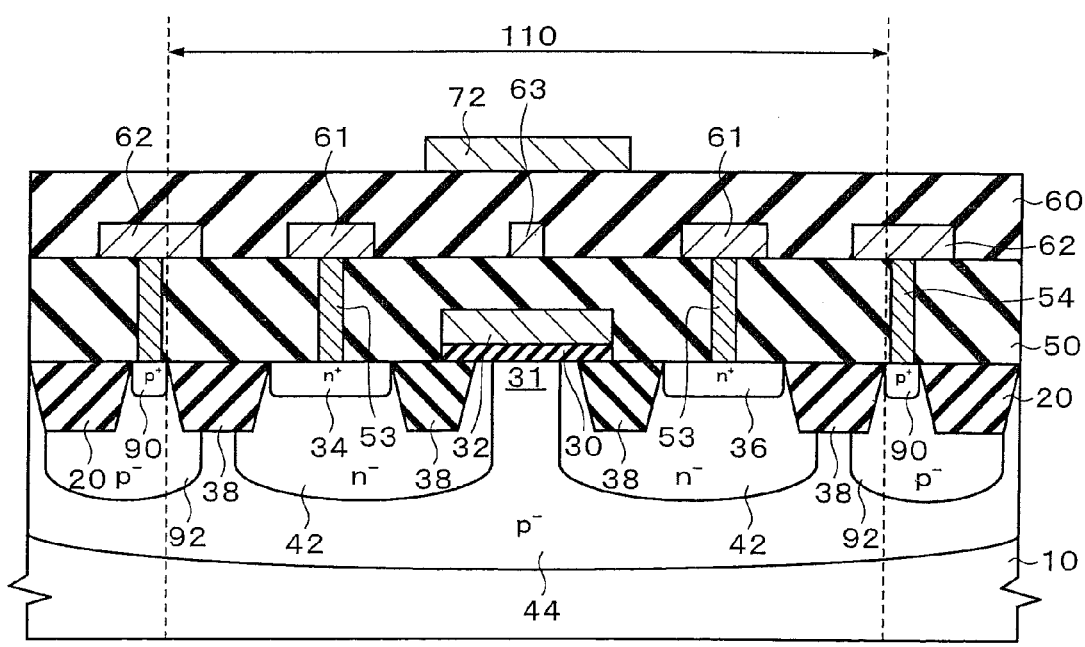
FIG. 3 is a sectional view taken along the line III-III in FIG. 1.

A semiconductor device 100 according to one embodiment of the invention are described. FIG. 1 is a plan view schematically showing the semiconductor device 100. FIG. 2 is a sectional view taken along the line II-II in FIG. 1. FIG. 3 is a sectional view taken along the line III-III in FIG. 1. In FIG. 1, first and second interlayer dielectrics 50 and 60 are omitted for convenience of illustration.

The semiconductor device 100 according to this embodiment includes a semiconductor layer 10. The semiconductor layer 10 may be a p-type silicon substrate or the like. A transistor formation region 110, a guard ring region 90, and an isolation region 20 are provided in the semiconductor device 100. As shown in FIG. 1, the transistor formation region 110 is enclosed by the guard ring region 90 when viewed from the top side. The planar shape of the guard ring region 90 may be rectangular as shown in FIG. 1, for example. The guard ring region 90 is formed of a p-type high-concentration impurity layer, for example. The guard ring region 90 is included in a p-type low-concentration impurity layer 92, for example. The guard ring region 90 is enclosed by the isolation region 20 when viewed from the top side. The planar shape of the isolation region 20 may be a rectangular ring as shown in FIG. 1, for example.

An n-type transistor is provided in the transistor formation region 110, for example. This transistor includes a gate insulating layer 30, a gate electrode 32, a channel region 31, an n-type source region 34, an n-type drain region 36, an offset insulating layer 38, an n-type low-concentration impurity layer 42, and a p-type well 44. This transistor may be a high-voltage transistor for high-voltage operation, for example.

The gate insulating layer 30 is provided on the channel region 31 and the offset insulating layer 38. The gate electrode 32 is formed on the gate insulating layer 30. The channel region 31 is provided at the top of the well 44 and is formed between the source region 34 and the drain region 36 through the offset insulating layer 38. The source region 34 and the drain region 36 are provided at the top of the well 44 and are formed on either side of the gate electrode 32 in the channel length direction (direction Y) when viewed from the top side. The offset insulating layer 38 is embedded (formed) in the semiconductor layer 10 on the upper surface side. The offset insulating layer 38 is formed in the semiconductor layer 10 in the transistor formation region 110 in a region other than the channel region 31, the source region 34, and the drain region 36. Specifically, the offset insulating layer 38 is formed in the semiconductor layer 10 in the transistor formation region 110 to avoid the channel region 31, the source region 34, and the drain region 36. The low-concentration impurity layer 42 is formed at the top of the well 44. The low-concentration impurity layer 42 includes the source region 34 and the drain region 36. The low-concentration impurity layer 42 covers the offset insulating layer 38 formed under the gate insulating layer 30. The well 44 is formed at the top of the semiconductor layer 10. The well 44 includes the n-type low-concentration impurity layer 42 and the channel region 31 in the transistor formation region 110. The well 44 includes the p-type low-concentration impurity layer 92.

The semiconductor device 100 further includes a first interlayer dielectric 50, a first shield layer 62, a second interlayer dielectric 60, and a second shield layer 72. The first interlayer dielectric 50 is formed above the semiconductor layer 10. The first shield layer 62 is formed on the first interlayer dielectric 50. Specifically, the first shield layer 62 is formed in the same step as the first wiring layer (e.g. wiring layer 63 in the example shown in the drawings). The second interlayer dielectric 60 is formed above the first interlayer dielectric 50. The second shield layer 72 is formed on the second interlayer dielectric 60. Specifically, the second shield layer 72 is formed in the same step as the second wiring layer (not shown).

The first shield layer 62 is formed above the guard ring region 90. The first shield layer 62 is electrically connected with the guard ring region 90. The first shield layer 62 is provided outside ends 33 and 35 of the gate electrode 32 in the channel width direction (direction X in FIG. 1) when viewed from the top side. Specifically, the first shield layer 62 is provided outside one end 33 of the gate electrode 32 in the channel width direction and is provided outside the other end 35 of the gate electrode 32 in the channel width direction when viewed from the top side. The planar shape of the first shield layer 62 may be a rectangular ring as shown in FIG. 1, for example. The first shield layer 62 may completely cover the guard ring region 90 when viewed from the top side. The first shield layer 62 may protrude from the guard ring region 90 when viewed from the top side. Specifically, the first shield layer 62 may overlap the guard ring region 90 and the offset insulating layer 38 and the isolation region 20 near the guard ring region 90 when viewed from the top side. The first shield layer 62 may have a width greater than the width of the guard ring region 90. The first shield layer 62 reduces the effects of a high potential applied to the wiring layer (not shown) formed above the first shield layer 62 on the semiconductor layer 10.

The second shield layer 72 is provided in at least one of a first region 12 and a second region 14 when viewed from the top side. The first region 12 is a region between at least part of one edge 33 of the gate electrode 32 in the channel width direction (direction X) and at least part of an edge 67 of the first shield layer 62 opposite to the edge 33 in the outward direction of the gate electrode 32 (positive direction of the direction X). The length of the edge 33 of the gate electrode 32 in the channel width direction is equal to the length of the edge 67 of the first shield layer 62 opposite to the edge 33. The second region 14 is a region between at least part of the other edge 35 of the gate electrode 32 in the channel width direction and at least part of an edge 69 of the first shield layer 62 opposite to the edge 35 in the outward direction of the gate electrode 32 (negative direction of the direction X). The length of the edge 35 of the gate electrode 32 in the channel width direction is equal to the length of the edge 69 of the first shield layer 62 opposite to the edge 35.

In the example shown in FIGS. 1 to 3, the second shield layer 72 is provided at least in the first region 12 and the second region 14. In FIG. 1, the first region 12 and the second region 14 are the regions indicated by the diagonal lines. In the example shown in the drawings, the first region 12 is a region between the entire edge 33 of the gate electrode 32 in the channel width direction and the entire edge 67 of the first shield layer 62 opposite to the edge 33. The planar shape of the first region 12 is rectangular as shown in FIG. 1, for example. The width of the first region 12 in the channel length direction (direction Y) may be equal to the width of the gate electrode 32 in the channel length direction. In the example shown in the drawings, the second region 14 is a region between the entire edge 35 of the gate electrode 32 in the channel width direction and the entire edge 69 of the first shield layer 62 opposite to the edge 35. The planar shape of the second region 14 is rectangular as shown in FIG. 1, for example. The width of the second region 14 in the channel length direction may be equal to the width of the gate electrode 32 in the channel length direction.

In the example shown in the drawings, the second shield layer 72 is one rectangular plate. The second shield layer 72 may completely cover the gate electrode 32, the offset insulating layer 38 in the first region 12, and the offset insulating layers 38 in the second region 14 when viewed from the top side. The edge portion of the second shield layer 72 may protrude from the formation region of the gate electrode 32, the first region 12, and the second region 14 when viewed from the top side. The edge of the second shield layer 72 in the channel width direction (direction X) may overlap part of the first shield layer 62 when viewed from the top side.

The second shield layer 72 may be electrically connected with the gate electrode 32. In more detail, the second shield layer 72 is connected with the wiring layer 63 through a contact layer 64 provided in a contact hole formed through the second interlayer dielectric 60. The wiring layer 63 is connected with the gate electrode 32 through a contact layer 55 provided in a contact hole formed through the first interlayer dielectric 50.

In the semiconductor device 100 according to this embodiment, the second shield layer 72 may be electrically connected with the gate electrode 32. Specifically, the second shield layer 72 is set at the potential of the gate electrode 32 when the transistor formed in the transistor formation region 110 is in an OFF state. When the transistor is in an OFF state, the potential of the gate electrode 32 may be set at the potential of the well 44 or the potential of the semiconductor layer 10 in the region in which the impurity layer is not formed (substrate potential), for example. These potentials may be arbitrarily set within the guaranteed withstand voltage. For example, these potentials may be set at a ground potential. Specifically, the semiconductor device 100 according to this embodiment allows the potential of the second shield layer 72 to be fixed when the transistor is in an OFF state and allows the potential of the second shield layer 72 to be lower than the potential of the wiring layer (not shown) formed above the second shield layer 72. As a result, the potential distribution due to the wiring layer does not exist or is reduced under the second shield layer 72. Specifically, the second shield layer 72 reduces the effects of the high potential (e.g. 20 to 80 V) applied to the wiring layer on the layer under the second shield layer 72. In the semiconductor device 100 according to this embodiment, the second shield layer 72 is provided at least in the first region 12 and the second region 14 when viewed from the top side. Therefore, the semiconductor device 100 according to this embodiment allows the potential applied to the parasitic MOS transistor, which is formed by the wiring layer to which the high potential is applied, the offset insulating layer 38 positioned under the wiring layer, and the semiconductor layer 10 positioned under the offset insulating layer 38 (low-concentration impurity layer 92 in the example shown in the drawings), to be reduced in the first region 12 and the second region 14. This prevents the parasitic MOS transistor from operating, whereby malfunction of the semiconductor device 100 can be prevented. Therefore, this embodiment can provide a highly reliable semiconductor device 100 and can increase the degrees of freedom of the layout of the wiring layer formed above the second shield layer 72.

In the semiconductor device 100 according to this embodiment, the second shield layer 72 can prevent the parasitic MOS transistor from operating, as described above. Therefore, a situation is prevented in which the semiconductor device 100 malfunctions due to the conductive layer (wiring layer) in the second layer other than the second shield layer 72 formed on the second interlayer dielectric 60. Specifically, the semiconductor device 100 according to this embodiment can increase the degrees of freedom of the layout of the wiring layer in the second layer.

In the semiconductor device 100 according to this embodiment, the first region 12 and the second region 14 in which the second shield layer 72 is formed are provided in the region in which the distance between the outer edge of the gate electrode 32 and the inner edge of the first shield layer 62 becomes minimum when viewed from the top side. Specifically, the distances between the edges 33 and 35 of the gate electrode 32 in the channel width direction (direction X) and the edges 67 and 69 of the first shield layer 62 opposite to the edges 33 and 35 are shorter than the distance between the edge of the gate electrode 32 in the channel length direction (direction Y) and the edge of the first shield layer 62 opposite thereto, for example. Therefore, the semiconductor device 100 according to this embodiment allows the areas of the first region 12 and the second region 14 in which the second shield layer 72 is provided to be minimized when viewed from the top side. This increases the degrees of freedom of the conductive layer (wiring layer) in the second layer other than the second shield layer 72 formed on the second interlayer dielectric 60.

In the semiconductor device 100 according to this embodiment, the first shield layer 62 is formed in the first layer on the first interlayer dielectric 50, and the second shield layer 72 is formed in the second layer on the second interlayer dielectric 60. This ensures a specific distance between the wiring layer 63 which connects the gate electrode 32 and the second shield layer 72 and the first shield layer 62 so that the wiring layer 63 does not contact the first shield layer 62, and allows an electric field occurring due to the high potential of the wiring layer (not shown) formed above the second shield layer 72 to be shielded by the second shield layer 72.

In the semiconductor device 100 according to this embodiment, the second shield layer 72 is provided in the first region 12 and the second region 14. Therefore, malfunction of the semiconductor device 100 can be more reliably prevented in comparison with the case where the second shield layer 72 is not provided in either the first region 12 or the second region 14 such as in a modification described later.

A modification according to this embodiment is described below. The following modification is only an example. Note that the invention is not limited to the following modification.

The above example illustrates the case where the second shield layer 72 is one rectangular plate. Note that the second shield layer 72 may have a ring-like planar shape, for example.

The above example illustrates the case where the second shield layer 72 is provided at least in the first region 12 and the second region 14. Note that the second shield layer 72 may not be provided in either the first region 12 or the second region 14, for example.

Figure 4:
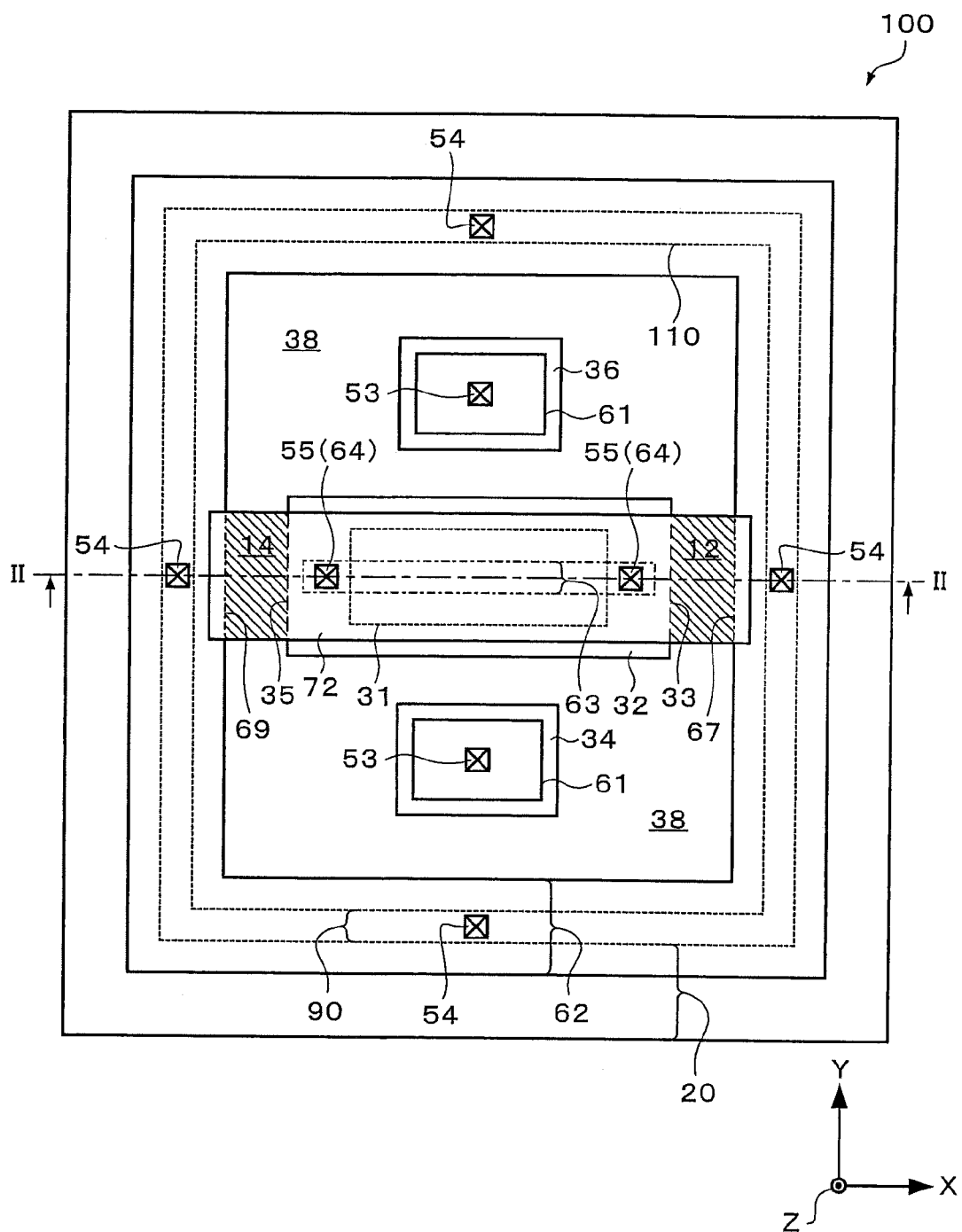
FIG. 4 is a plan view schematically showing a semiconductor device according to a modification of one embodiment of the invention.

As shown in FIG. 4, the first region 12 may be a region between part of the edge 33 of the gate electrode 32 in the channel width direction and part of the edge 67 of the first shield layer 62 opposite to the edge 33, for example. The second region 14 may be a region between part of the edge 35 of the gate electrode 32 in the channel width direction and part of the edge 69 of the first shield layer 62 opposite to the edge 35, for example. In this case, the second shield layer 72 may be provided in at least one of the first region 12 and the second region 14. FIG. 4 is a plan view schematically showing the semiconductor device in this case.

Figure 5:
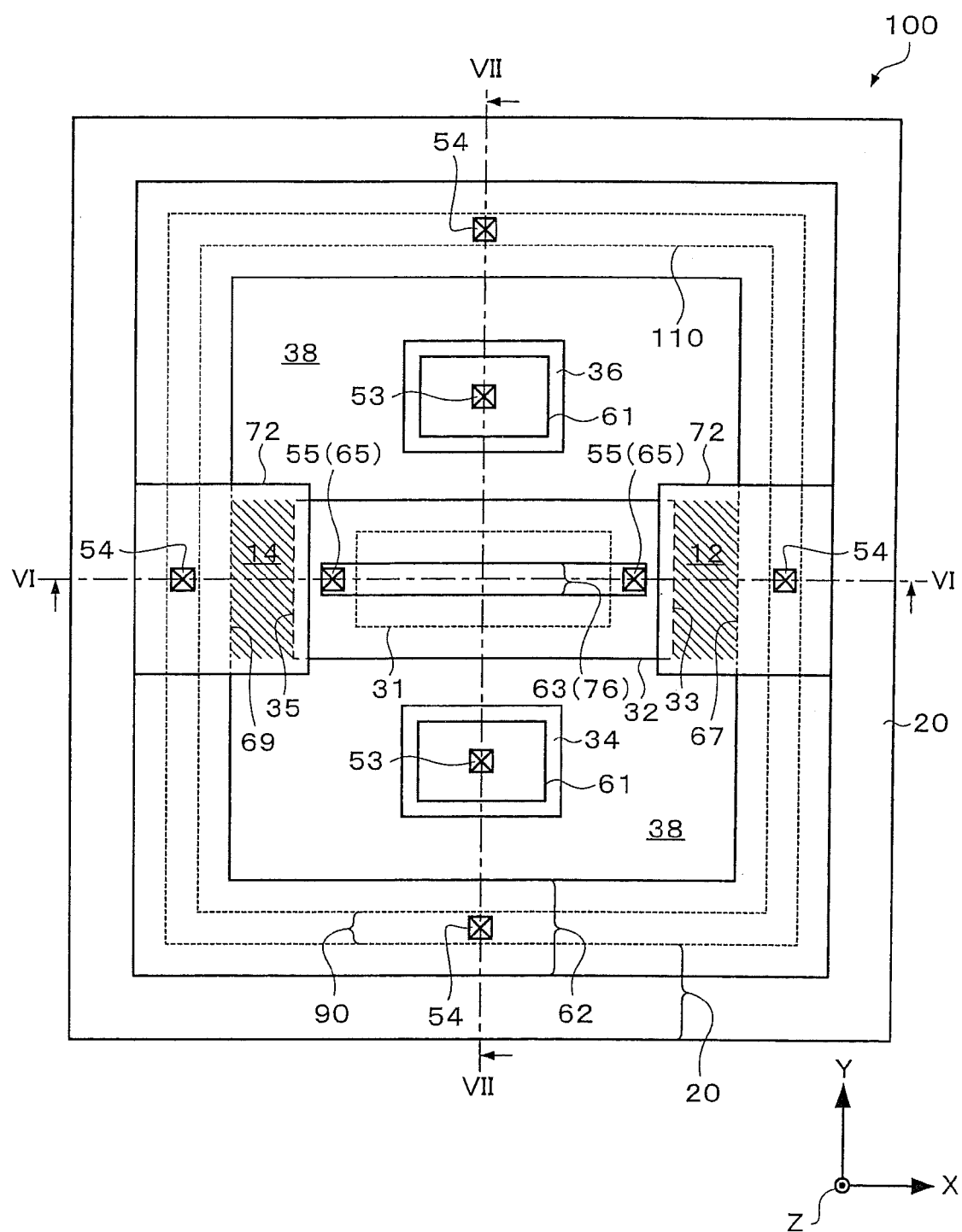
FIG. 5 is a plan view schematically showing a semiconductor device according to a modification of one embodiment of the invention.
Figure 6:
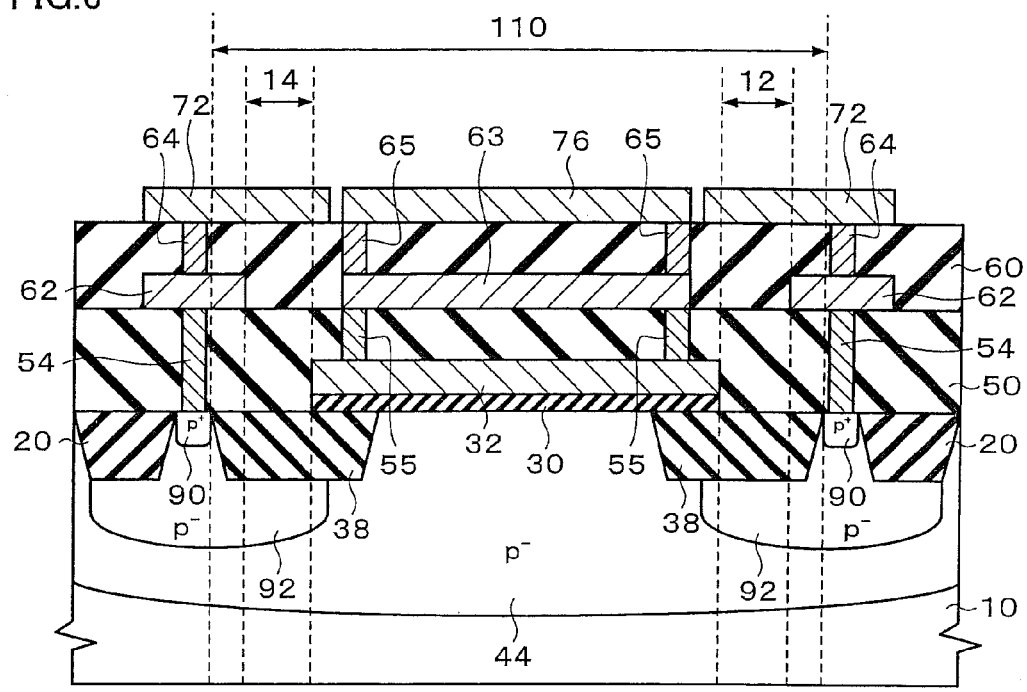
FIG. 6 is a sectional view taken along the line VI-VI in FIG. 5.
Figure 7:
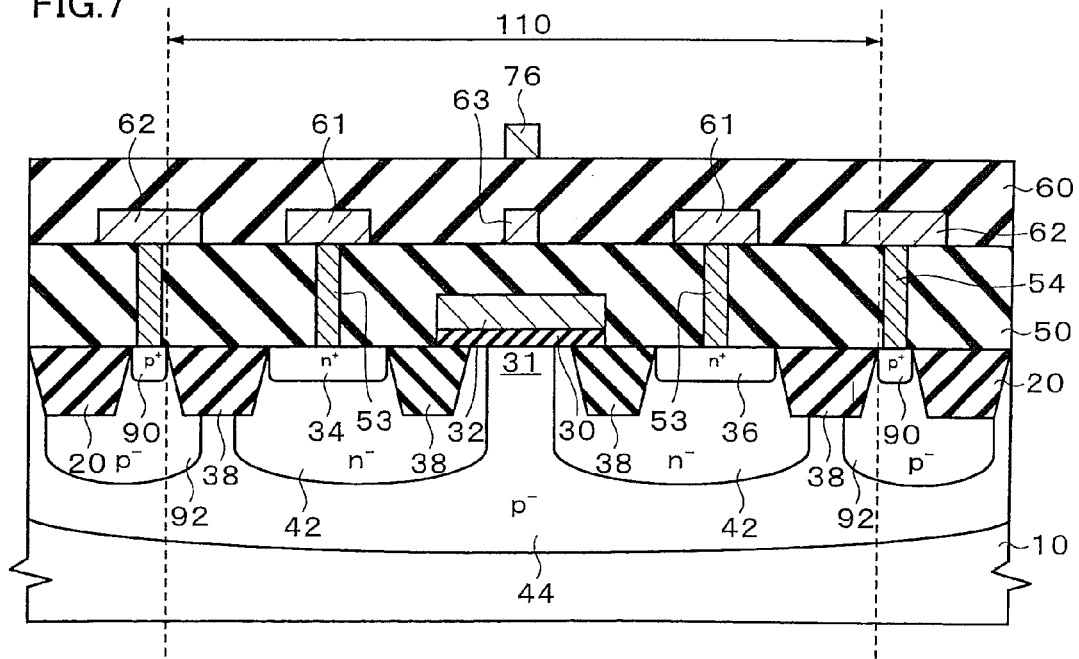
FIG. 7 is a sectional view taken along the line VII-VII in FIG. 5.

The above example illustrates the case where the second shield layer 72 is electrically connected with the gate electrode 32. Note that the second shield layer 72 may be electrically connected with the guard ring region 90, as shown in FIGS. 5 to 7. In more detail, the second shield layer 72 is connected with the first shield layer 62 through the contact layer 64 provided in a contact hole formed through the second interlayer dielectric 60. The first shield layer 62 is connected with the guard ring region 90 through a contact layer 54 provided in a contact hole formed through the first interlayer dielectric 50. FIG. 5 is a plan view schematically showing the semiconductor device in this case. FIG. 6 is a sectional view taken along the line VI-VI in FIG. 5. FIG. 7 is a sectional view taken along the line VII-VII in FIG. 5. In FIG. 5, the first and second interlayer dielectrics 50 and 60 are omitted for convenience of illustration.

In the example shown in FIGS. 5 to 7, the second shield layer 72 is formed of two rectangular plates. The second shield layer 72 is formed so that the second shield layer 72 does not contact a wiring layer 76 connected with the wiring layer 63 through a contact layer 65 provided in a contact hole formed through the second interlayer dielectric 60.

According to this modification, the second shield layer 72 is set at the potential of the guard ring region 90. As a result, the parasitic MOS transistor can be prevented from operating.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of the invention.

For example, the semiconductor device 100 may be formed in a state in which the p-type and the n-type of each layer in the above embodiment are interchanged.

What is claimed is:

1. A semiconductor device comprising:
   a gate electrode formed above a substrate, the gate electrode having a first edge in a channel width direction when viewed from a top side;
   a source region and a drain region formed in the substrate;
   an impurity layer formed in the substrate, the impurity layer surrounding the gate electrode, the source region and the drain region when viewed from the top side, the impurity layer having an inner wall, the inner wall including a second edge in the channel width direction when viewed from the top side; and
   a first wiring layer formed above at least a part of a first region of the substrate, the first region being located between the first edge and the second edge when viewed from the top side.

2. The device according to claim 1,
   wherein the channel width direction overlaps the gate electrode when viewed from the top side.
3. The device according to claim 2,
   wherein the inner wall of the impurity layer including a third edge in the channel width direction when viewed from the top side, and
   wherein a first distance from the first edge to the second edge is shorter than a second distance from the first edge to the third edge when viewed from the top side.
4. The device according to claim 3,
   wherein the first wiring layer electrically contacts the gate electrode.
5. The device according to claim 4, further comprising:
   a first contact layer formed on the gate electrode and contacting the gate electrode;
   a second wiring layer formed on the first contact layer and contacting the first contact layer; and
   a second contact layer formed on the second wiring layer and contacting the second wiring layer;
   wherein the first wiring layer contacts the second contact layer.
6. The device according to claim 5,
   wherein the impurity layer is a guard ring.
7. The device according to claim 5,
   wherein the inner wall having a rectangular shape when viewed from the top side.
8. The device according to claim 1,
   wherein a first length of the gate electrode in a channel length direction when viewed from the top side is shorter than a second length of the first wiring layer in the channel length direction when viewed from the top side.
9. The device according to claim 2,
   wherein a first length of the gate electrode in a channel length direction when viewed from the top side is shorter than a second length of the first wiring layer in the channel length direction when viewed from the top side.
10. The device according to claim 3,
    wherein a first length of the gate electrode in a channel length direction when viewed from the top side is shorter than a second length of the first wiring layer in the channel length direction when viewed from the top side.
11. The device according to claim 4,
    wherein a first length of the gate electrode in a channel length direction when viewed from the top side is shorter than a second length of the first wiring layer in the channel length direction when viewed from the top side.
12. The device according to claim 5,
    wherein a first length of the gate electrode in a channel length direction when viewed from the top side is shorter than a second length of the first wiring layer in the channel length direction when viewed from the top side.
13. The device according to claim 6,
    wherein a first length of the gate electrode in a channel length direction when viewed from the top side is shorter than a second length of the first wiring layer in the channel length direction when viewed from the top side.
14. The device according to claim 7,
    wherein a first length of the gate electrode in a channel length direction when viewed from the top side is shorter than a second length of the first wiring layer in the channel length direction when viewed from the top side.
15. The device according to claim 1,
    wherein a first length of the gate electrode in a channel length direction when viewed from the top side is longer than a second length of the first wiring layer in the channel length direction when viewed from the top side.

16. The device according to claim 2,
wherein a first length of the gate electrode in a channel length direction when viewed from the top side is longer than a second length of the first wiring layer in the channel length direction when viewed from the top side.

17. The device according to claim 3,
wherein a first length of the gate electrode in a channel length direction when viewed from the top side is longer than a second length of the first wiring layer in the channel length direction when viewed from the top side.

18. The device according to claim 4,
wherein a first length of the gate electrode in a channel length direction when viewed from the top side is longer than a second length of the first wiring layer in the channel length direction when viewed from the top side.

19. The device according to claim 5,
wherein a first length of the gate electrode in a channel length direction when viewed from the top side is longer than a second length of the first wiring layer in the channel length direction when viewed from the top side.

20. The device according to claim 6,
wherein a first length of the gate electrode in a channel length direction when viewed from the top side is longer than a second length of the first wiring layer in the channel length direction when viewed from the top side.

21. The device according to claim 7,
wherein a first length of the gate electrode in a channel length direction when viewed from the top side is longer than a second length of the first wiring layer in the channel length direction when viewed from the top side.

* * * * *